United States Patent [19]

Waller, Jr.

[11] Patent Number: 5,124,657
[45] Date of Patent: Jun. 23, 1992

[54] COMPOSITE SIGNAL PROCESSOR AND SINGLE-ENDED NOISE REDUCTION SYSTEM

[76] Inventor: James K. Waller, Jr., 741 Morgan Hill, Lake Orion, Mich. 48035

[21] Appl. No.: 418,125

[22] Filed: Oct. 6, 1989

[51] Int. Cl.⁵ .......................... H03B 1/00; H03G 7/00
[52] U.S. Cl. .................................... 328/165; 328/167; 307/520; 333/14; 381/106
[58] Field of Search ................. 328/165, 167; 307/520, 307/521; 333/14; 381/106

[56] References Cited

U.S. PATENT DOCUMENTS

| | | | |
|---|---|---|---|
| 4,507,791 | 3/1985 | Gundry | 333/14 |
| 4,647,867 | 3/1987 | Butler et al. | 330/269 |
| 4,647,876 | 3/1987 | Waller, Jr. | 333/14 |
| 4,696,044 | 9/1987 | Waller, Jr. | 381/106 |

OTHER PUBLICATIONS

Palevski et al., "Lateral Tunneling, Ballistic Transport, and Spectroscopy in a Two-Dimensional Electron Gas", Physical Review Letters, vol. 62, No. 15, Apr. 10, 1989, pp. 1776-1779.

Primary Examiner—Stanley D. Miller
Assistant Examiner—Trong Phan
Attorney, Agent, or Firm—Head & Johnson

[57] ABSTRACT

A composite signal processor and single-ended noise reduction system uses a split input to the single-ended noise reduction circuit in such a manner that the audio signal from the output of the signal processor circuit is dynamically filtered in response to a control signal derived from the unaltered audio signal prior to signal processing. User selective switching is also provided to permit the signal processor and the noise reduction circuit to be used simultaneously or independently.

4 Claims, 1 Drawing Sheet

COMPOSITE SIGNAL PROCESSOR AND SINGLE-ENDED NOISE REDUCTION SYSTEM

BACKGROUND OF THE INVENTION

This invention relates to non-complimentary or single-ended noise reduction systems and more particularly concerns single-ended noise reduction systems used in conjunction with other types of signal processors to form a composite signal processor and single-ended noise reduction system.

Single-ended noise reduction systems such as are described in my U.S. Pat. Nos. 4,647,867 and 4,696,044 are now quite well known. Composite systems combining some form of signal processor with single ended noise reduction systems are also known, such as Rocktron Corporation's Model 300A Compressor and Model RX20 Audio Enhancer. These composite systems, and other such systems presently in use, utilize a prior art configuration in which the signal processor circuit is followed by the single-ended noise reduction system circuitry. It is desirable to have the noise reduction system following the signal processing circuit so as to reduce both the noise present in the input signal and the noise inherent in the signal processor. However, there are undesirable limitations in such systems as they are presently practiced.

Typically, these composite systems are designed to use the composite circuits together or to use either circuit separately with the other circuit being bypassed. Consequently, the noise reduction system of the composite system must be able to handle the full dynamic range of the unaltered input signal which typically could be as small as 50dB. This presents a problem when a compressor circuit precedes the noise reduction system and reduces the dynamic range of the input signal. Since compressor circuits allow the user to change the dynamic range of the input signal, it is, as a practical matter, impossible for the noise reduction circuit to work in conjunction with the dynamic range that the compressor provides. Because the amount of compression and the ratio of compression are both user adjustable, there is no simple and economical noise reduction circuit which provides the two modes of operation needed to meet the noise reduction requirements of both the unaltered input signal and the compressed signal.

The use of a composite audio enhancer with a single-ended noise reduction system also presents problems. While the detection circuit for the single-ended noise reduction system is optimized to work independently, breathing and pumping are encountered when the detection circuit of the single-ended noise reduction system senses the output of the signal processing device. This occurs because the dynamic filter control signal is itself derived from the enhanced signal which is already dynamically emphasized in relation to its high frequency content, thus introducing more high frequency signal to the filter than was present in the input signal.

It is, therefore, an object of the present invention to provide a composite signal processor and single-ended noise reduction system employing a signal processor circuit preceding a single-ended noise reduction system to provide noise reduction of both the input signal and the signal processor wherein the detection circuit of the single-ended noise reduction system senses the input signal before it is processed. Yet another object of the present invention is to provide a composite signal processor and single-ended noise reduction system which eliminates mistracking of the noise reduction circuit. It is also an object of the present invention to provide a system which permits two modes of operation, either with or without the signal processor in the audio path, without any adverse dynamic effect of the single-ended noise reduction system.

SUMMARY OF THE INVENTION

In accordance with the present invention a composite signal processor and single-ended noise reduction system is provided in which the input to the single-ended noise reduction circuit is a split input including an audio input receiving the audio signal from the output of the signal processor circuit and a detection input receiving the unaltered audio signal prior to signal processing.

BRIEF DESCRIPTION OF THE DRAWINGS

Other objects and advantages of the invention will become apparent upon reading the following detailed description and upon reference to the drawings in which.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE INVENTION

Figure 1:
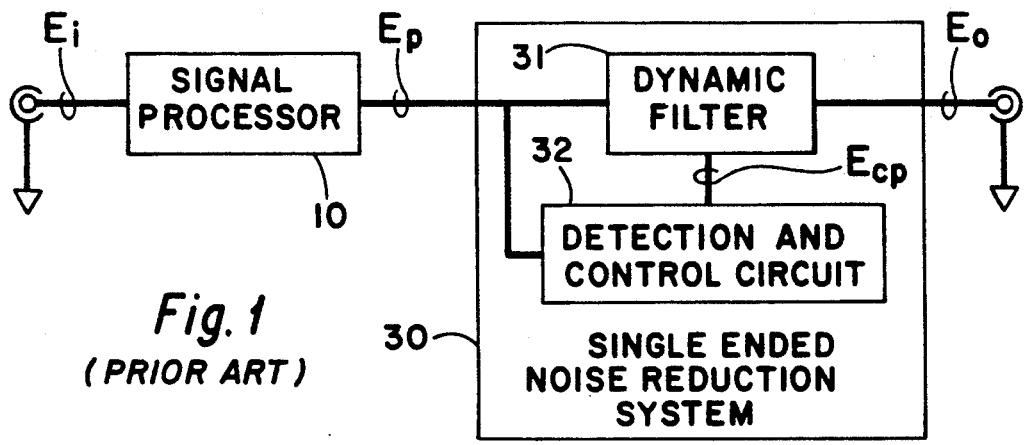
FIG. 1 is a block diagram of an embodiment of prior art composite signal processor and single-ended noise reduction systems.

Turning first to FIG. 1, a composite signal processor and single-ended noise reduction system typical of the prior art is illustrated. An input signal $E_i$ is fed to a signal processor 10 which may, for example, be a compressor, expander, enhancer, equalizer or other commonly known processing circuit. The processed signal $E_p$ is then fed through a single-ended noise reduction system 30 in which a dynamic filter 31 is controlled by a detection and control circuit 32. The control signal $E_{cp}$ is derived by the detection and control circuit 32 from the processed signal $E_p$. The resulting output signal $E_o$ is thus a product of the processed signal $E_p$ filtered in response to variations in the processed signal $E_p$, resulting in the problems hereinbefore discussed.

Figure 2:
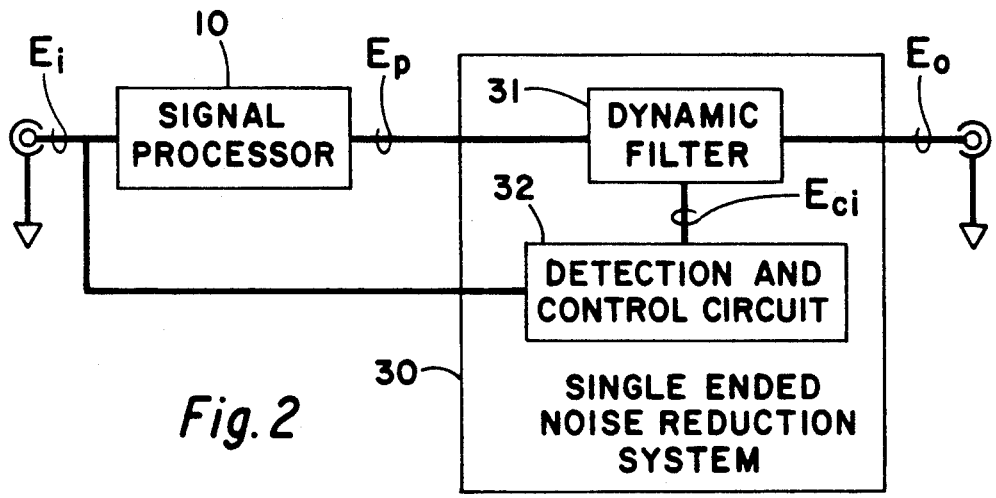
FIG. 2 is a block diagram of an embodiment of the present composite signal processor and single-ended noise reduction system.

Turning to FIG. 2, the present composite signal processor and single-ended noise reduction system is illustrated. The system is similar in all respects to that of FIG. 1 except that the input to the detection and control circuit 32 is the input signal $E_i$ rather than the processed signal $E_p$, thus providing a control signal $E_{ci}$ to the dynamic filter 31 which is not responsive to the conditioning performed by the signal processor 10, but is responsive only to the input signal $E_i$. The control signal $E_{ci}$ is proportional to the amplitude and frequency content of the input signal $E_i$. The operation of the single-ended noise reduction system 30 is more fully explained in my U.S. Pat. No. 4,696,044. The single-ended noise reduction system may include expansion circuitry or any combination of circuits presently used in conjunction with noise reduction circuits.

Figure 3:
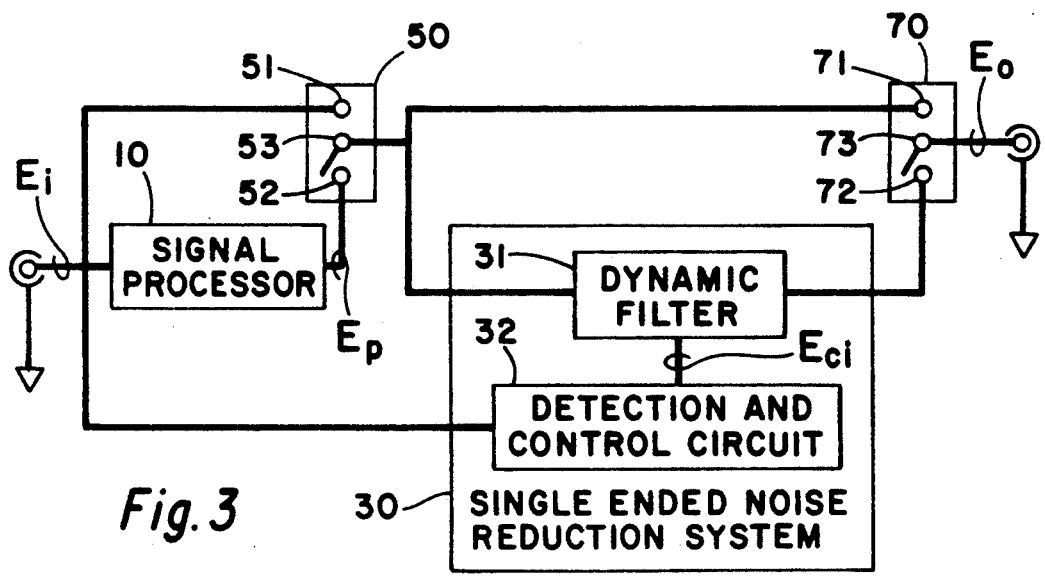
FIG. 3 is a block diagram of a modification of the embodiment of FIG. 2 in which the composite system allows the individual components to be operated without the other component, as the user requires.

Turning to FIG. 3, the composite signal processor and single-ended noise reduction system of FIG. 2 is modified to allow the single ended noise reduction system 30 to selectively dynamically filter either the input signal $E_i$ or the process signal $E_p$ or, alternatively, to process the input signal $E_i$ without subsequently dynamically filtering the processed signal $E_p$. In this embodiment, a first selector switch 50 has a first input terminal 51 receiving the input signal $E_i$ and a second input terminal 52 receiving the processed signal $E_p$. The output terminal 53 of the switch 50 is connected to the input of the dynamic filter 31. Thus, by operation of the first switch 50, the user may selectively feed either the input signal $E_i$ or the processed signal $E_p$ to the dynamic filter 31. A second selector switch 70 is also provided in which a first input terminal 71 is connected to the output terminal 53 of the first selector switch 50. A second input terminal 72 of the switch 70 is connected to the output of the dynamic filter 31. The output terminal 73 of the switch 70 is connected to the system output terminal. Thus, by selective operation of the switch 70, the user may elect to bypass the single-ended noise reduction system 30 while still using the signal processor 10.

It will be apparent to those skilled in the art that many alternatives, modifications and variations may be made in the invention herein described without departing from the scope of the invention. All matters contained in this description or shown in the drawings are illustrative and not a limitation of the scope of the invention. It is intended to embrace all such alternatives, modifications and variations as fall within the spirit of the appended claims.

What is claimed is:

1. In a noise reduction circuit having a user variable processor, a method of deriving an output signal from an input signal to said user variable processor comprising the steps of:
   user variably conditioning the input signal to provide a user variable processed signal;
   dynamically filtering the user variable processed signal to produce an output signal;
   deriving a signal proportional to the amplitude and frequency content of the input signal to the user variable processor to produce a control signal; and
   varying the band width of the output signal in response to variations in the control signal.

2. In a noise reduction circuit having a user variable processor, a method of deriving an output signal from an input signal to said user variable processor comprising the steps of:
   user variably conditioning the input signal to provide a user variable process signal;
   selectively dynamically filtering either the user variable processed signal or the input signal to produce a filtered signal;
   deriving a signal proportional to the amplitude and frequency content of the input signal to the user variable processor to produce a control signal;
   varying the band width of the output signal in response to variations in the control signal; and
   selectively passing either the user variable signal or the filtered signal to produce an output signal.

3. In a noise reduction circuit having a user variable processor, a apparatus for deriving an output signal from an input signal to said user variable processor comprising:
   user variable means for conditioning said input signal to provide a user variable processed signal;
   means for dynamically filtering said user variable processed signal to produce an output signal; and
   means for deriving a signal proportional to the amplitude and frequency content of said input signal to the user variable processor to produce a control signal and for varying the band width of said output signal in response to variations in said control signal.

4. In a noise reduction circuit having a user variable processor, a apparatus for deriving an output signal from an input signal to said user variable processor comprising:
   user variable means for conditioning said input signal to provide a user variable process signal;
   means for selectively dynamically filtering either said user variable processed signal or said input signal to produce a filtered signal;
   means for deriving a signal proportional to the amplitude and frequency content of said input signal to the user variable processor to produce a control signal and for varying the band width of said output signal in response to variations in said control signal; and
   means for selectively passing either said user variable processed signal or said filtered signal to produce an output signal.

* * * * *